(12) United States Patent
Huang et al.

(10) Patent No.: US 12,114,447 B2
(45) Date of Patent: Oct. 8, 2024

(54) ELECTRONIC DEVICE

(71) Applicant: Huawei Technologies Co., Ltd., Shenzhen (CN)

(72) Inventors: Bo Huang, Shanghai (CN); Weihua Mao, Shanghai (CN); Zhixiao Xu, Shanghai (CN); Bo Wu, Shanghai (CN); Peng Zha, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 295 days.

(21) Appl. No.: 17/638,477

(22) PCT Filed: Aug. 6, 2020

(86) PCT No.: PCT/CN2020/107363
§ 371 (c)(1),
(2) Date: Feb. 25, 2022

(87) PCT Pub. No.: WO2021/036730
PCT Pub. Date: Mar. 4, 2021

(65) Prior Publication Data
US 2022/0408578 A1     Dec. 22, 2022

(30) Foreign Application Priority Data
Aug. 28, 2019   (CN) .......................... 201910799430.7

(51) Int. Cl.
*H05K 5/00*     (2006.01)
*H05K 5/02*     (2006.01)
(Continued)

(52) U.S. Cl.
CPC ......... *H05K 5/0226* (2013.01); *H05K 5/0018* (2022.08); *H10K 77/111* (2023.02); *H10K 2102/311* (2023.02)

(58) Field of Classification Search
CPC .. H05K 5/0226; H05K 5/0018; H10K 77/111; H10K 2102/311; H04M 1/0279;
(Continued)

(56) References Cited

U.S. PATENT DOCUMENTS 6,377,324 B1    4/2002   Katsura
9,173,288 B1   10/2015   Kim
(Continued)

FOREIGN PATENT DOCUMENTS

CN    105761615 A    7/2016
CN    106060192 A   10/2016
(Continued)

*Primary Examiner* — Rockshana D Chowdhury
(74) *Attorney, Agent, or Firm* — Conley Rose, P.C.

(57) ABSTRACT

An electronic device includes a first housing, a hinge apparatus, a second housing, and a flexible display, where two opposite ends of the hinge apparatus are connected to the first housing and the second housing, and the flexible display is mounted on the first housing and the second housing, wherein a thickness of one end that is of the second housing and that is close to the hinge apparatus is different from a thickness of one end that is of the second housing and that is away from the hinge apparatus, and wherein, in a folded state, a thickness of one end that is of the electronic device and that is close to the hinge apparatus is different from a thickness of one end that is of the electronic device and that is away from the hinge apparatus.

20 Claims, 9 Drawing Sheets

(51) Int. Cl.
*H10K 77/10* (2023.01)
*H10K 102/00* (2023.01)

(58) Field of Classification Search
CPC . H04M 1/0268; H04M 1/0214; G06F 1/1616;
G06F 1/1652
See application file for complete search history.

(56) References Cited

U.S. PATENT DOCUMENTS

| | | | | |
|---|---|---|---|---|
| 9,811,119 | B2* | 11/2017 | Seo | G06F 1/1641 |
| 10,104,790 | B2* | 10/2018 | Lee | G06F 1/1616 |
| 10,437,414 | B2* | 10/2019 | Kang | G06F 3/04842 |
| 10,539,978 | B2* | 1/2020 | Lee | H04M 1/0268 |
| 10,601,968 | B1* | 3/2020 | Koh | H04M 1/0222 |
| 10,795,415 | B2* | 10/2020 | Cavallaro | G06F 1/1652 |
| 10,890,949 | B2* | 1/2021 | Ou | G06F 1/1616 |
| 11,617,276 | B2* | 3/2023 | Song | B60K 37/10 |
| | | | | 362/489 |
| 11,644,868 | B2* | 5/2023 | Kim | H04M 1/0268 |
| | | | | 361/679.27 |
| 11,755,067 | B2* | 9/2023 | Park | H04M 1/0268 |
| | | | | 361/679.27 |
| 11,792,946 | B2* | 10/2023 | Park | H05K 5/0017 |
| | | | | 361/679.01 |
| 11,800,667 | B2* | 10/2023 | Oh | H01Q 1/243 |
| 11,803,214 | B2* | 10/2023 | Yang | G06F 1/1652 |
| 2006/0050169 | A1* | 3/2006 | Misawa | G06F 1/1652 |
| | | | | 348/333.06 |
| 2014/0111954 | A1 | 4/2014 | Lee et al. | |
| 2015/0055287 | A1 | 2/2015 | Seo | |
| 2015/0153780 | A1* | 6/2015 | Maatta | G06F 1/1679 |
| | | | | 361/679.27 |
| 2015/0227286 | A1 | 8/2015 | Kang et al. | |
| 2016/0070303 | A1* | 3/2016 | Lee | G06F 1/1641 |
| | | | | 361/679.27 |
| 2016/0291642 | A1 | 10/2016 | Kwak et al. | |
| 2017/0068275 | A1 | 3/2017 | Lee et al. | |
| 2017/0353633 | A1 | 12/2017 | Eromaki | |
| 2017/0374749 | A1* | 12/2017 | Lee | G06F 1/1652 |
| 2018/0110139 | A1 | 4/2018 | Seo et al. | |
| 2018/0198896 | A1 | 7/2018 | Kang et al. | |
| 2021/0132664 | A1* | 5/2021 | Park | G06F 1/1641 |
| 2021/0311525 | A1* | 10/2021 | Seo | H04M 1/0268 |

FOREIGN PATENT DOCUMENTS

| | | |
|---|---|---|
| CN | 107547700 A | 1/2018 |
| CN | 109313376 A | 2/2019 |
| CN | 209313879 U | 8/2019 |
| CN | 110557481 A | 12/2019 |
| EP | 2811365 A1 | 12/2014 |
| WO | 2020172307 A1 | 8/2020 |

\* cited by examiner

ELECTRONIC DEVICE

CROSS-REFERENCE TO RELATED APPLICATIONS

This is a U.S. National Stage of International Patent Application No. PCT/CN2020/107363 filed on Aug. 6, 2020, which claims priority to Chinese Patent Application No. 201910799430.7 filed on Aug. 28, 2019. Both of the aforementioned applications are hereby incorporated by reference in their entireties.

TECHNICAL FIELD

This application relates to the field of terminal devices, and in particular, to an electronic device.

BACKGROUND

A foldable mobile phone is a current research hotspot. A conventional foldable mobile phone is thick in a folded state. Consequently, appearance experience is poor, and it is not conducive to holding by a hand.

SUMMARY

This application provides a foldable electronic device. The electronic device is thin in a folded state. This implements good appearance experience, and is conducive to holding the electronic device by a hand.

The electronic device includes a first housing, a hinge apparatus, a second housing, and a flexible display, where two opposite ends of the hinge apparatus are respectively connected to the first housing and the second housing, and the hinge apparatus can be deformed, so that the first housing is folded or unfolded relative to the second housing, and the flexible display is mounted on the first housing and the second housing; and a thickness of one end that is of the second housing and that is close to the hinge apparatus is different from a thickness of one end that is of the second housing and that is away from the hinge apparatus, and in a folded state, a thickness of one end that is of the electronic device and that is close to the hinge apparatus is different from a thickness of one end that is of the electronic device and that is away from the hinge apparatus.

The electronic device may be folded into "two layers", to be specific, the electronic device may include one bending part and two flat parts that are respectively connected to two opposite sides of the bending part, and the two flat parts may rotate towards each other to be mutually stacked, so that the electronic device is in a two-layer form. Alternatively, the electronic device may be folded into "a plurality of layers", to be specific, the electronic device may include at least two bending parts and at least three flat parts, two adjacent flat parts are connected by one bending part, and two adjacent flat parts may rotate towards each other to be mutually stacked, so that the electronic device is in a form of at least two layers.

Both the first housing and the second housing may be used as bearers of the flexible display. The hinge apparatus includes several parts that are rotatably connected, and that the hinge apparatus is deformed means that relative rotation is generated among the several parts. Parts that are in the several parts and that are located at two ends are respectively fixedly connected to the first housing and the second housing, and relative rotation between the first housing and the second housing is implemented through the relative rotation of the several parts. When the first housing rotates in a direction towards the second housing, the first housing is gradually folded relative to the second housing. Otherwise, when the first housing rotates in a direction away from the second housing, the first housing is gradually unfolded relative to the second housing.

The flexible display may include a first flat part, a bending part, and a second flat part that are successively connected. The first flat part is mounted on the first housing, the second flat part is mounted on the second housing, and the bending part is located between the first housing and the second housing. When the first housing rotates relative to the second housing, the first flat part may be driven to rotate relative to the second flat part. In this process, the bending part is deformed.

In the solution of this application, one end that is of the first housing and that is close to the hinge apparatus and one end that is of the first housing and that is away from the hinge apparatus may have thicknesses that are basically the same.

For example, in an implementation, the first housing has a parting surface and a placement surface. When the first housing is folded relative to the second housing, the parting surface faces the second housing, and the parting surface is parallel to the first flat part of the flexible display. The placement surface is parallel to the parting surface, and when the first housing is folded relative to the second housing, the placement surface is opposite to the second housing. Specifically, both the parting surface and the placement surface are two outer contour surfaces of the first housing, and the parting surface is close to the first flat part (for example, the first flat part is mounted on the parting surface, or the first flat part is basically flush with the parting surface). The placement surface is away from the first flat part, and the placement surface is a surface that is in contact with a mesa when the first housing is placed on the mesa. The placement surface may be an entire surface that is of the first housing and that is opposite to the first flat part, or may be only a local area of a surface that is of the first housing and that is opposite to the first flat part. Because the parting surface is parallel to and spaced from the placement surface, a thickness of an area including the placement surface in the first housing is constant. For the solution in which the placement surface is the entire surface that is of the first housing and that is opposite to the first part, the first housing has a constant thickness from the end close to the hinge apparatus to the end away from the hinge apparatus. For the solution in which the placement surface is the local area of the surface that is of the first housing and that is opposite to the first part, areas on two opposite sides of the placement surface (the two sides are respectively one side close to the hinge apparatus and one side away from the hinge apparatus) may be basically symmetrical, so that the thickness of the end that is of the first housing and that is close to the hinge apparatus is basically the same as the thickness of the end that is of the first housing and that is away from the hinge apparatus.

Alternatively, in another implementation, the thickness of the end that is of the first housing and that is close to the hinge apparatus may be greater than or less than the thickness of the end that is of the first housing and that is away from the hinge apparatus. In this implementation, a thickness of each position of the first housing may be gradually changed continuously and smoothly or may be abruptly changed.

The thickness of the end that is of the second housing and that is close to the hinge apparatus may be greater than or less than the thickness of the end that is of the second housing and that is away from the hinge apparatus. A thickness of each position of the second housing may be gradually changed continuously and smoothly or may be abruptly changed. For the electronic device, in a folded form, the thickness of the end that is of the electronic device and that is close to the hinge apparatus may be greater than or less than the thickness of the end that is of the electronic device and that is away from the hinge apparatus. A thickness of each position of the electronic device may be gradually changed continuously and smoothly or may be abruptly changed.

In the solution of this application, thickness distribution of the first housing and thickness distribution of the second housing determine thickness distribution of the entire electronic device. The thickness distribution of the first housing and the thickness distribution of the second housing may be combined as required, provided that the overall electronic device has a difference between thicknesses at two ends (the two ends are the end close to the hinge apparatus and the end away from the hinge apparatus).

A maximum thickness of the electronic device is limited to thick parts in the entire electronic device, for example, a camera module and the hinge apparatus. It is difficult to make these thick parts thin. However, in a folded state, a thickness of one end that is of a conventional electronic device and that is close to a hinge apparatus is basically the same as a thickness of one end that is of the conventional electronic device and that is away from the hinge apparatus. This causes a large overall thickness of the conventional electronic device. In the solution of this application, in the folded state, a thick part may be disposed on one end that is of the electronic device and that has a large thickness, and the thickness of the end may be basically equal to that of the conventional electronic device. In the folded state, the other end of the electronic device is thinned (for example, "thinning" may be implemented by disposing a thin part or disposing fewer parts). Compared with the conventional electronic device, the electronic device is visually thinner and lighter, and holding feeling of a user is better.

In an implementation, in the folded state, one end that is of the second housing and that has a small thickness and one end that is of the electronic device and that has a small thickness are located on a same side of the electronic device. That is, the end that is of the second housing and that has a small thickness may correspond to the end that is of the electronic device and that has a small thickness, and one end that is of the second housing and that has a large thickness may correspond to the end that is of the electronic device and that has a large thickness. The second housing, as a part of the electronic device, forms a thick-thick correspondence and a thin-thin correspondence with the electronic device, so that appearance consistency of the electronic device is good, and appearance experience is good.

Alternatively, in another implementation, the end that is of the second housing and that has a large thickness may be located on one side that is of the electronic device and that has a small thickness, and the end that is of the second housing and that has a small thickness may be located on one side that is of the electronic device and that has a large thickness. That is, the end that is of the second housing and that has a large thickness may correspond to the end that is of the electronic device and that has a small thickness, and the end that is of the second housing and that has a small thickness may correspond to the end that is of the electronic device and that has a large thickness. The thicknesses of the two ends of the first housing are unequal, a thick end of the first housing corresponds to a thin end of the second housing, and a thin end of the first housing corresponds to a thick end of the second housing. The second housing, as a part of the electronic device, forms a thick-thin correspondence and a thin-thick correspondence with the electronic device. This can give a product a differentiated appearance form and improve product recognition.

In an implementation, based on the solution in which the second housing forms the thick-thick correspondence and the thin-thin correspondence with the electronic device, the thickness of the end that is of the second housing and that is close to the hinge apparatus may be greater than the thickness of the end that is of the second housing and that is away from the hinge apparatus. That is, for the second housing and the electronic device, thick ends are ends close to the hinge apparatus, and thin ends are ends away from the hinge apparatus. From the end close to the hinge apparatus to the end away from the hinge apparatus, the first housing may have a basically constant thickness. There is often space for thinning one end away from the hinge apparatus. Thinning the end enables a product design solution to have high feasibility and good mass productivity.

In an implementation, the flexible display includes a first flat part, a bending part, and a second flat part that are successively connected. The first flat part is mounted on the first housing, and the second flat part is mounted on the second housing. In the folded state, the flexible display is located between the second housing and the first housing, both the second flat part and most of bending part are accommodated in the second housing, and the first flat part and the remaining small part of bending part may be accommodated in the first housing. Alternatively, both the second flat part and the entire bending part are accommodated in the second housing, and the first flat part may be accommodated in the first housing. In the folded state, at least most of the flexible display is accommodated in the second housing that is thinned, so that a position of the flexible display can be disposed based on an appearance form of a product. A large space of the end that is of the electronic device and that is close to the hinge apparatus is fully used to accommodate the bending part, so that the flexible display has high utilization of a structural space.

In an implementation, the second housing includes a first housing part and a support part. The first housing part and the first housing are respectively connected to the two opposite ends of the hinge apparatus, and the first housing part can be folded or unfolded relative to the first housing. The support part is movably mounted in the first housing part, and the second flat part is mounted on a surface that is of the support part and that is opposite to the second housing. When the first housing part is folded relative to the first housing, the support part rotates relative to the first housing, and one end that is of the support part and that is close to the hinge apparatus gradually approaches the first housing part. In this implementation, the support part is disposed in the first housing part, and the end that is of the support part and that is close to the hinge apparatus may gradually approach the first housing part in a folding process, so that one end that is of the second flat part and that is close to the hinge apparatus and a part that is of the bending part and that is adjacent to the second flat part also gradually approach the first housing part under traction of the support part, so that both the at least large part of the bending part and the second flat part are finally accommodated in the first housing part.

In an implementation, the electronic device may further include an electronic component. The electronic component is mounted in the first housing, and the first flat part is mounted on the first housing and covers the electronic component. In this implementation, the second housing bears the second flat part, and there may be no electronic component mounted in the second housing. Therefore, the second housing does not need to have a large internal space, so that the second housing can be thinned as much as possible, and the entire electronic device can be slimmer. In addition, a wire of the electronic component may be arranged only in the first housing without passing through the first housing, passing through the hinge apparatus, and extending into the second housing. In this way, sealing design is performed only on the first housing, and sealing of the hinge apparatus and the second housing does not need to be specially considered for a wire problem, thereby reducing difficulty of sealed protection of the entire electronic device. In addition, in this implementation, an electrical device, for example, a fingerprint sensor or a light sensor, may still be integrated in the second flat part. This can improve a screen-to-body ratio of the electronic device. However, the electrical device integrated in the second flat part may be electrically connected to a circuit board through the wire of the flexible display without an additional wire. Therefore, sealing design for the second housing does not need to be considered for the electrical device.

In an implementation, in the folded state, the second housing includes a second housing part and a cover. One end of the second housing part is connected to the hinge apparatus, the second housing part can be folded or unfolded relative to the first housing part, and the cover is fixedly connected to one end that is of the second housing part and that is away from the hinge apparatus. In the folded state, the flexible display is accommodated between the second housing and the first housing. The flexible display includes a first flat part mounted on the first housing and a second flat part mounted on the second housing. The second flat part is opposite to both the second housing part and the cover, and in the folded state, the cover covers a local area of the first flat part. In this implementation, the second flat part mounted on the second housing may be in contact with both the second housing part and the cover or only in contact with the second housing part. In this implementation, a separated second housing including the second housing part and the cover is disposed, so that a product appearance that is different from that of the conventional electronic device can be manufactured.

In an implementation, there is a step between a surface that is of the cover and that is away from the second flat part and a surface that is of the second housing part and that is away from the second flat part. When the electronic device is folded, the cover may be sunk, relative to the second housing part, in a direction towards the first housing. Therefore, the second housing is divided into two parts of different thicknesses. The sunken cover can make an end part of the second housing thinner and visually make the second housing and electronic device lighter and thinner.

In an implementation, the cover is made of a transparent material. When the cover covers the local area of the first flat part, a user can see the local area through the cover. To fully use the local area to display information to improve user experience, a call reminder, an information preview, a time, a weather forecast, a power reminder, a signal status, and the like may be displayed in the local area.

In an implementation, the electronic device may further include an optical device, and the optical device is disposed in the first housing and is located in the local area. In this implementation, the optical device may be disposed under the flexible display and falls into the local area, or may be disposed in the flexible display (for example, the flexible display may form a mounting cavity, and the optical device is mounted in the mounting cavity; or the optical device is integrated in a layer structure of the flexible display, and the optical device is formed together in a manufacturing process of the flexible display) and falls into the local area. The optical device is configured to collect light of a target object to generate an electrical signal, and the electrical signal carries information about the target object. When the electronic device is folded, the cover covers the flexible display and the optical device on the first housing, the light of the target object may be incident on the optical device through the cover, and the optical device senses the light to generate the electrical signal. The electrical signal may be output to a processing circuit for processing, to implement information collection of the target object (for example, an image of the target object may be obtained, approaching of the target object may be perceived, iris information may be obtained, and fingerprint information may be obtained). In the solution of this implementation, the user can collect information without opening the second housing, thereby improving user experience.

BRIEF DESCRIPTION OF DRAWINGS

To describe the technical solutions in the embodiments or the background of this application, the following describes the accompanying drawings required in the embodiments or the background of this application.

DESCRIPTION OF EMBODIMENTS

The following embodiments of this application provide an electronic device. The electronic device is an electronic product with a flexible display, and is a mobile phone, a tablet computer, an electronic reader, a vehicle-mounted device, or the like. The electronic device may be folded and unfolded. Specifically, the electronic device may include a bending part and flat parts connected to two opposite sides of the bending part. The bending part may be bent and deformed, so that the flat parts on the two sides of the bending part rotate towards or opposite to each other. When the flat parts on the two sides of the bending part rotate towards each other to be mutually stacked (the flat parts may be fitted with each other without a spacing or opposite to each other with a spacing), the electronic device is in a folded state in this case. Otherwise, when the flat parts on the two sides of the bending part rotate opposite to each other from a mutually stacked state to extreme positions (that is, when the flat parts can no longer rotate opposite to each other), the electronic device is in an unfolded state in this case. In the unfolded state, the flat parts on the two sides of the bending part may be completely unfolded or may be unfolded to form a bending angle or radian.

In this embodiment, the electronic device may be folded into "two layers", to be specific, the electronic device includes one bending part and two flat parts, and the two flat parts may rotate towards each other to be mutually stacked, so that the electronic device is in a two-layer form. For the electronic device that may be folded into "two layers", "unfolded" means that the two flat parts are completely unfolded or are unfolded to form a bending angle or radian. Alternatively, the electronic device may be folded into "a plurality of layers", to be specific, the electronic device includes at least two bending parts and at least three flat parts, two adjacent flat parts are connected by one bending part, and adjacent flat parts may rotate towards each other to be mutually stacked, so that the electronic device is in a two-layer form (for example, the electronic device includes two bending parts and three flat parts, two flat parts on two sides are stacked side by side on a flat part in the middle after being folded, and in this case, the electronic device is in a two-layer form; or after being folded, the first one in two flat parts on two sides is stacked on a flat part in the middle, the second one is stacked on the first one, and in this case, the electronic device is in a three-layer form). For the electronic device that may be folded into "a plurality of layers", "unfolded" may be implemented provided that two of the at least three flat parts are completely unfolded or are unfolded to form a bending angle or radian. The following uses an example in which the electronic device may be folded into "two layers" for description.

Figure 1:
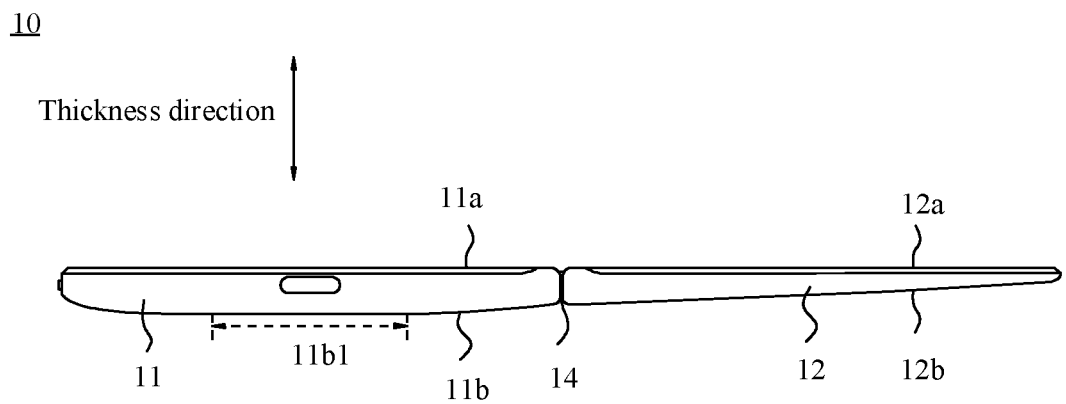
FIG. 1 is a schematic diagram of a side-view structure of an electronic device in an unfolded state according to an embodiment of this application.
Figure 2:
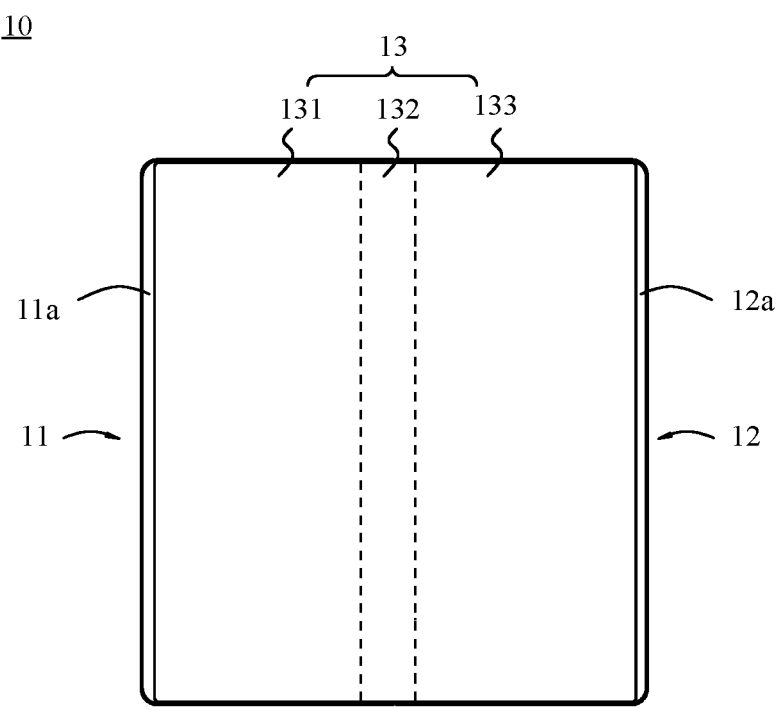
FIG. 2 is a schematic diagram of a top-view structure of the electronic device in FIG. 1.
Figure 3:
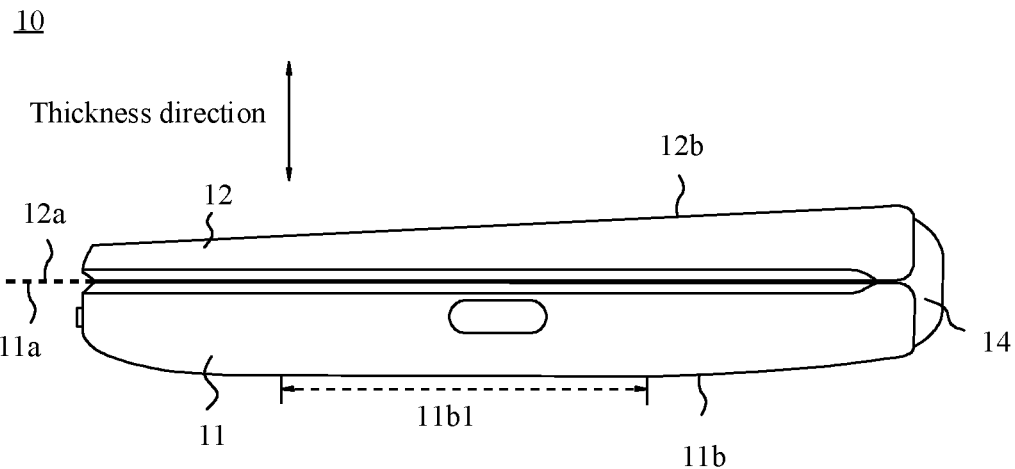
FIG. 3 is a schematic diagram of a side-view structure of the electronic device in FIG. 1 in a folded state.

As shown in FIG. 1 to FIG. 3, an electronic device 10 may include a first housing 11, a hinge apparatus 14, a second housing 12, and a flexible display 13. In FIG. 3, a lower part is the first housing 11, and an upper part is the second housing 12. This is merely an illustration. Actually, when the electronic device 10 is folded (that is, when the electronic device 10 is in a folded state, the same below), the upper part may alternatively be the first housing 11, and the lower part may be the second housing 12. In this embodiment, when the electronic device 10 is folded, the first housing 11 and the second housing 12 may be basically fitted with each other without a spacing. When the electronic device 10 is unfolded (that is, when the electronic device 10 is in an unfolded state, the same below), the first housing 11 and the second housing 12 may be completely unfolded.

In this embodiment, both the first housing 11 and the second housing 12 may be used as bearers of the flexible display 13. In an implementation, as shown in FIG. 1 and FIG. 2, the first housing 11 and the second housing 12 each may have a mounting slot. When the electronic device 10 is completely unfolded, a direction of an opening of the mounting slot of the first housing 11 is the same as a direction of an opening of the mounting slot of the second housing 12. The flexible display 13 is mounted in the two mounting slots (because the mounting slots are shielded by the flexible display 13, reference numerals are omitted), and slot walls of the mounting slots can be used to perform mounting limitation and protection on the flexible display 13. Both a first top surface 11a of the slot wall of the mounting slot on the first housing 11 and a second top surface 12a of the slot wall of the mounting slot on the second housing 12 may be planar, and the first top surface 11a and the second top surface 12a may be basically flush with each other when the electronic device 10 is completely unfolded. When the electronic device 10 is folded, the first top surface 11a and the second top surface 12a are basically fitted with each other. When the electronic device 10 is unfolded, a display surface (a surface facing a user) of the flexible display 13 may be basically flush with the first top surface 11a and the second top surface 12a. For example, the display surface of the flexible display 13 may be sunk by a small size relative to the first top surface 11a and the second top surface 12a, or be flush with the first top surface 11a and the second top surface 12a. In another implementation, there may alternatively be no mounting slot disposed on the first housing 11 and the second housing 12. The flexible display 13 is laid on a first mounting surface of the first housing 11 and a second mounting surface of the second housing 12, and a boundary of the flexible display 13 is aligned with both a boundary of the first mounting surface and a boundary of the second mounting surface.

The hinge apparatus 14 is an essential part of the electronic device 10 for implementing folding and unfolding. In this embodiment, the hinge apparatus 14 is disposed between the first housing 11 and the second housing 12, and two opposite ends of the hinge apparatus 14 are respectively connected to the first housing 11 and the second housing 12. The hinge apparatus 14 may include several parts that are rotatably connected (it may be considered that the hinge apparatus 14 is deformed when the several parts rotate relative to each other). Parts that are in the several parts and that are located at two ends are respectively fixedly connected to the first housing 11 and the second housing 12. Relative rotation between the first housing 11 and the second housing 12 is implemented through the relative rotation among the several parts. Based on a product requirement, the hinge apparatus 14 may have a corresponding structure, provided that folding and unfolding of the electronic device 10 can be implemented.

In this embodiment, the flexible display 13 includes but is not limited to a flexible organic light-emitting diode (Organic Light-Emitting Diode, OLED for short) display. As shown in FIG. 2, the flexible display 13 may include a first flat part 131, a bending part 132, and a second flat part 133 that are successively connected. The first flat part 131 is mounted on the first housing 11, the second flat part 133 is mounted on the second housing 12, and the bending part 132 is located between the first housing 11 and the second housing 12. The first housing 11, the hinge apparatus 14, and the second housing 12 are located on a same side of the flexible display 13. When the electronic device 10 is folded, the flexible display 13 may be located on an outer side or inner side of the electronic device 10. When the second housing 12 rotates relative to the first housing 11 (for example, when the user bends the electronic device 10, the second housing 12 rotates towards the first housing 11; or when the user unfolds the electronic device 10, the second housing 12 rotates opposite to the first housing 11), and the second flat part 133 may rotate relative to the first flat part 131, so that the bending part 132 is deformed (bent or unfolded). To better support the flexible display 13, improve structural strength of the display, and avoid abrasion, the electronic device 10 may further include a screen support layer. One surface of the screen support layer is fitted with the flexible display 13, and the other opposite surface is connected to the first housing 11 and the second housing 12. Certainly, the screen support layer is not essential.

Refer to FIG. 1 to FIG. 3. When the electronic device 10 is placed on a horizontal plane, in the unfolded or folded state, a display surface of the first flat part 131 on the first housing 11 may be parallel to the horizontal plane. Similarly, for an electronic device 20 to an electronic device 60 (which are further described below) shown in FIG. 4 to FIG. 8, in an unfolded state or a folded state, a display surface of a first flat part 131 may also be parallel to a horizontal plane. Therefore, a normal direction of the display surface of the first flat part 131 may be used as a thickness direction. Alternatively, for an electronic device 70 (which is further described below) shown in FIG. 9, in an unfolded state or a folded state, a surface that is of a first housing 71 and that is in contact with a horizontal plane may be parallel to the horizontal plane. A normal direction of the surface that is of the first housing 71 and that is in contact with the horizontal plane may be used as a thickness direction. Based on definitions of the foregoing two thickness directions, a thickness of the first housing, a thickness of the second housing, and a thickness of the electronic device in the folded state may be determined.

Specifically, as shown in FIG. 1 and FIG. 3, the first housing 11 has the first top surface 11*a* and a first back surface 11*b*, and the first top surface 11*a* and the first back surface 11*b* are respectively located at two opposite ends in the thickness direction. The first back surface 11*b* is an outer contour surface of a side that is of the first housing 11 and that is opposite to the first flat part 131, and the first back surface 11*b* may be a plane or a curved surface with a radian. When the user holds the electronic device 10, the first back surface 11*b* may be in contact with the user. When the normal direction of the display surface of the first flat part 131 is used as the thickness direction, in the thickness direction, a distance from a position on the first top surface 11*a* to a corresponding position on the first back surface 11*b* may be referred to as a thickness of the first housing 11 at the position.

Similarly, as shown in FIG. 1 and FIG. 3, the second housing 12 has the second top surface 12*a* and a second back surface 12*b*, and the second top surface 12*a* and the second back surface 12*b* are respectively located at two opposite ends in the thickness direction. The second back surface 12*b* is an outer contour surface of a side that is of the second housing 12 and that is opposite to the second flat part 133, and the second back surface 12*b* may be a plane or a curved surface with a radian. When the user holds the electronic device 10, the second back surface 12 may be in contact with the user. When the normal direction of the display surface of the first flat part 131 is used as the thickness direction, in the thickness direction, a distance from a position on the second top surface 12*a* to a corresponding position on the second back surface 12*b* may be referred to as a thickness of the second housing 12 at the position.

The thickness of the electronic device 10 is discussed in this embodiment in the folded state. As shown in FIG. 3, when the electronic device 10 is folded, the second back surface 12*b* and the first back surface 11*b* are respectively located at the two opposite ends in the thickness direction. When the normal direction of the display surface of the first flat part 131 is used as the thickness direction, in the thickness direction, a distance from a position on the second back surface 12*b* to a corresponding position on the first back surface 11*b* may be referred to as a thickness of the electronic device 10 at the position.

In this embodiment, a thickness of one end that is of the second housing 12 and that is close to the hinge apparatus 14 is different from a thickness of one end that is of the second housing 12 and that is away from the hinge apparatus 14.

In an implementation, as shown in FIG. 1 and FIG. 3, the thickness of the end that is of the second housing 12 and that is close to the hinge apparatus 14 is greater than the thickness of the end that is of the second housing 12 and that is away from the hinge apparatus 14. To be specific, in the thickness direction, a distance from one end that is of the second top surface 12*a* and that is close to the hinge apparatus 14 to one end that is of the second back surface 12*b* and that is close to the hinge apparatus 14 is greater than a distance from one end that is of the second top surface 12*a* and that is away from the hinge apparatus 14 to one end that is of the second back surface 12*b* and that is away from the hinge apparatus 14. Similarly, as shown in FIG. 5 to FIG. 8, for a second housing 32 to a second housing 62 in an electronic device 30 to the electronic device 60, a thickness of one end close to a hinge apparatus 14 is greater than a thickness of one end away from the hinge apparatus 14.

Figure 4:
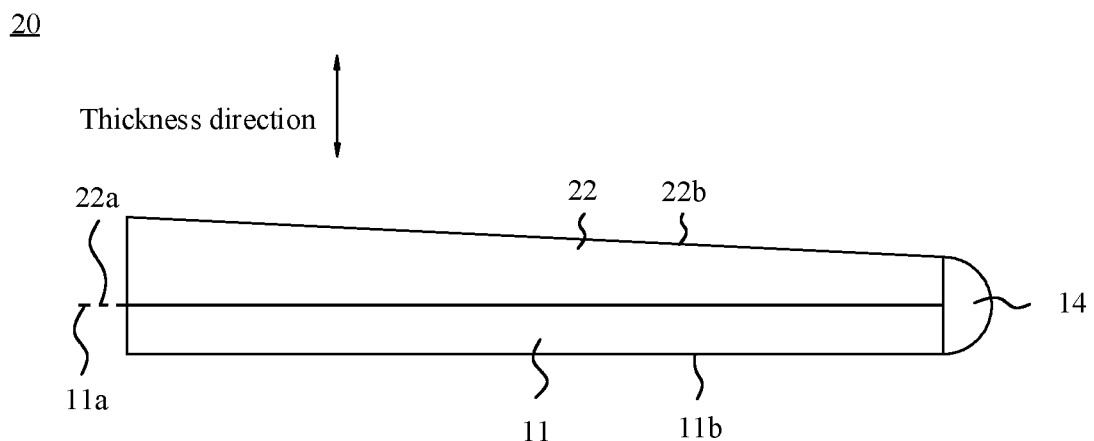
FIG. 4 is a schematic diagram of a side-view structure of another electronic device in a folded state according to an embodiment of this application.

In another implementation, as shown in FIG. 4, a thickness of one end that is of a second housing 22 of the electronic device 20 and that is close to a hinge apparatus 14 is less than a thickness of one end that is of the second housing 22 and that is away from the hinge apparatus 14. To be specific, in the thickness direction, a distance from one end that is of a second top surface 22*a* and that is close to the hinge apparatus 14 to one end that is of a second back surface 22*b* and that is close to the hinge apparatus 14 is less than a distance from one end that is of the second top surface 22*a* and that is away from the hinge apparatus 14 to one end that is of the second back surface 22*b* and that is away from the hinge apparatus 14. In an implementation of this embodiment, as shown in FIG. 1, FIG. 3, and FIG. 4, from the end close to the hinge apparatus 14 to the end away from the hinge apparatus 14, a thickness of each position of the second housing may be gradually changed continuously and smoothly. A change rate of the thickness may be basically constant. If a coordinate of each position of the second housing and each corresponding thickness are used as variables to construct a thickness curve, the thickness curve is basically an oblique line.

Figure 5:
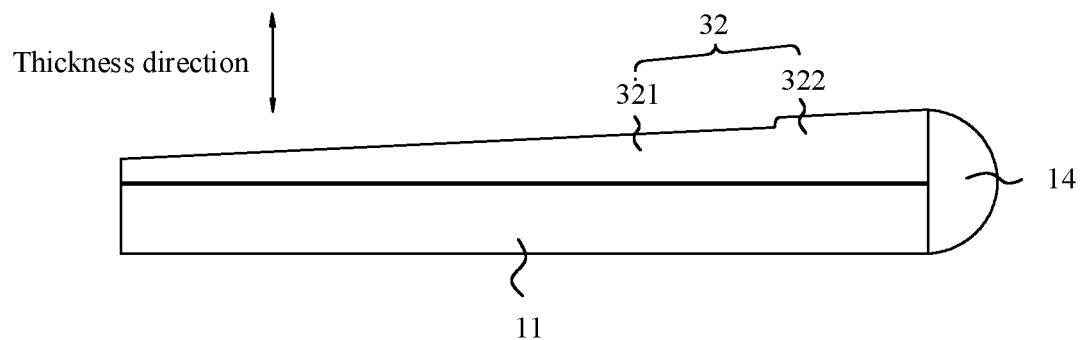
FIG. 5 is a schematic diagram of a side-view structure of another electronic device in a folded state according to an embodiment of this application.
Figure 6:
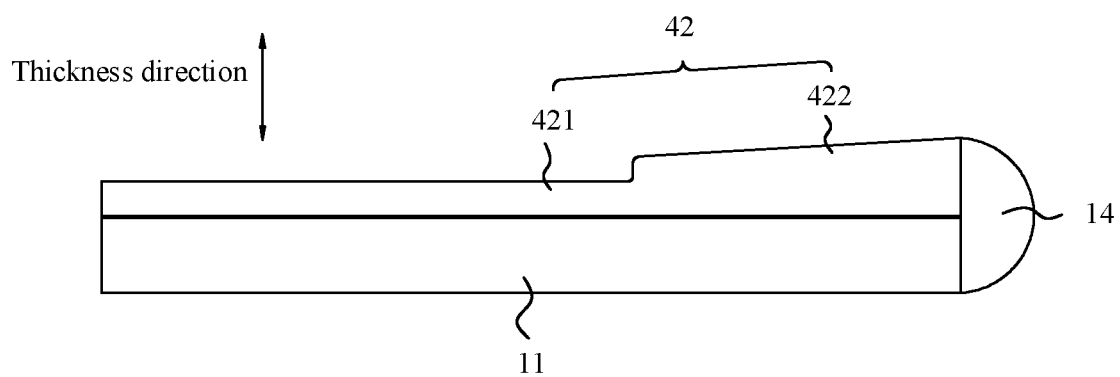
FIG. 6 is a schematic diagram of a side-view structure of another electronic device in a folded state according to an embodiment of this application.
Figure 7:
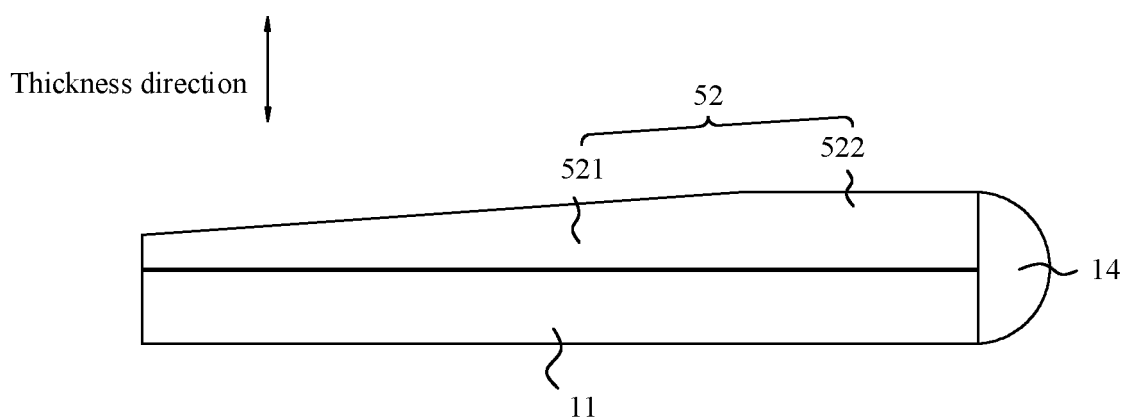
FIG. 7 is a schematic diagram of a side-view structure of another electronic device in a folded state according to an embodiment of this application.
Figure 8:
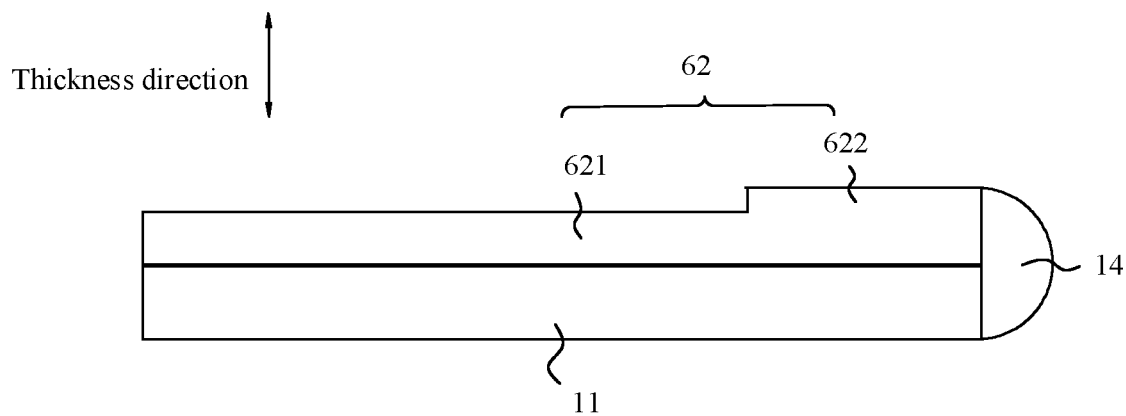
FIG. 8 is a schematic diagram of a side-view structure of another electronic device in a folded state according to an embodiment of this application.

In another implementation, the thickness of the second housing may be abruptly changed, and the thickness curve of the second housing may be a broken line. As shown in FIG. 5, in an implementation, the second housing 32 of the electronic device 30 includes a first part 321 and a second part 322, both thicknesses of the first part 321 and the second part 322 are in a gradual change form, a thickness of an adjacent part between the first part 321 and the second part 322 is abruptly changed, and a thickness change rate is basically unchanged. Alternatively, as shown in FIG. 6, in another implementation, a second housing 42 of an electronic device 40 includes a first part 421 and a second part 422, a thickness of the first part 421 is basically constant, a thickness of the second part 422 is in a gradual change form, and both a thickness and a thickness change rate of an adjacent part between the first part 421 and the second part 422 are abruptly changed (a thickness change rate of the first part 421 and a thickness change rate of the second part 422 are respectively zero and non-zero). Alternatively, as shown in FIG. 7, in another implementation, a second housing 52 of an electronic device 50 includes a first part 521 and a second part 522, a thickness of the first part 521 is in a gradual change form, a thickness of the second part 522 is basically constant, and a thickness change rate of an adjacent part between the first part 521 and the second part 522 is abruptly changed (a thickness change rate of the first part 521 and a thickness change rate of the second part 522 are respectively zero and non-zero). Alternatively, as shown in FIG. 8, in another implementation, the second housing 62 of the electronic device 60 includes a first part 621 and a second part 622, both thicknesses of the first part 621 and the second part 622 may be basically constant, and a thickness of an adjacent part between the first part 621 and the second part 622 is abruptly changed.

In an implementation of this embodiment, as shown in FIG. 1 to FIG. 8, the normal direction of the display surface of the first flat part 131 is used as the thickness direction, and a thickness of one end that is of the first housing and that is away from the hinge apparatus may be basically the same as a thickness of one end that is of the first housing and that is close to the hinge apparatus 14. For example, as shown in FIG. 1 and FIG. 3, the first housing 11 has a parting surface and a placement surface 11b1, and the parting surface is basically parallel to and is spaced from the placement surface 11b1. When the electronic device 10 is folded, the parting surface faces the second housing 12, the parting surface is basically parallel to the first flat part 131, and the parting surface may be the first top surface 11a or the first mounting surface. To be specific, if the parting surface is the first top surface 11a, the first housing 11 has a first mounting slot, the first flat part 131 is mounted in the first mounting slot, the parting surface surrounds a peripheral edge of the first flat part 131, and the parting surface is basically flush with the first flat part 131; or if the parting surface is the first mounting surface, there is no first mounting slot disposed on the first housing 11, the first flat part 131 is directly disposed on the parting surface, and a boundary of the first flat part 131 is aligned with a boundary of the parting surface. When the electronic device 10 is folded, the placement surface 11b1 is opposite to the second housing 12, and the placement surface 11b1 may be a local area of the first back surface 11b, or the placement surface 11b1 is the first back surface 11b.

In this implementation, a spacing from the placement surface 11b1 to the parting surface is unique, and a thickness of an area that includes the placement surface 11b1 in the first housing 11 is constant. For the solution in which the placement surface 11b1 is the local area of the first back surface 11b, both areas on two opposite sides of the placement surface 11b1 (the two sides are respectively one side close to the hinge apparatus 14 and one side away from the hinge apparatus 14) may be arc surfaces, so that two ends of the first back surface 11b are rounded. The two arc surfaces on the two opposite sides of the placement surface 11b1 may be basically symmetrical, so that the thickness of the end that is of the first housing 11 and that is close to the hinge apparatus 14 is basically the same as the thickness of the end that is of the first housing 11 and that is away from the hinge apparatus 14. For the solution in which the placement surface 11b1 is the first back surface 11b, thicknesses of various positions of the first housing 11 are the same.

Figure 9:
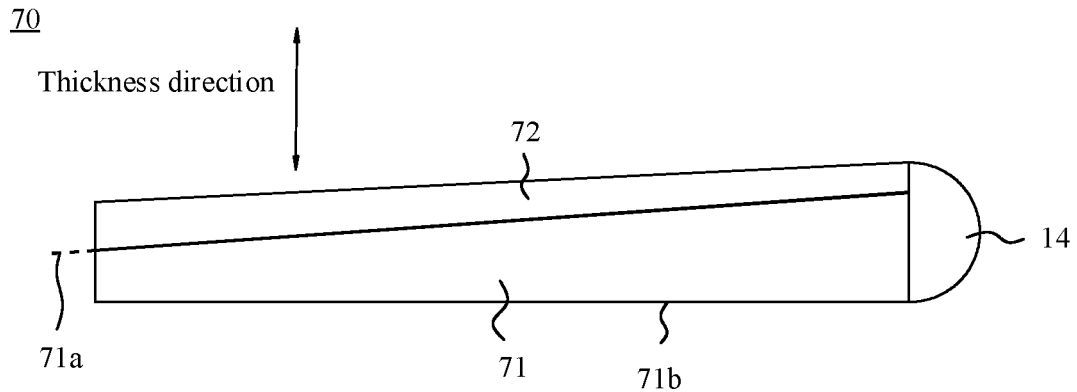
FIG. 9 is a schematic diagram of a side-view structure of another electronic device in a folded state according to an embodiment of this application.

Alternatively, in another implementation, the thickness of the end that is of the first housing and that is away from the hinge apparatus 14 may be different from the thickness of the end that is of the first housing and that is close to the hinge apparatus 14. As shown in FIG. 9, in an implementation, the first housing 71 of the electronic device 70 has a surface 71b that is in contact with a horizontal plane, the surface 71b is basically parallel to the horizontal plane, and a parting surface 71a of the first housing 71 is inclined relative to the horizontal plane. In this implementation, a normal direction of the surface 71b may be used as a thickness direction. A thickness of one end that is of the first housing 71 and that is close to a hinge apparatus 14 may be larger, and a thickness of one end that is of the first housing 71 and that is away from the hinge apparatus 14 may be smaller. From the end away from the hinge apparatus 14 to the end close to the hinge apparatus 14, a thickness of each position of the first housing 71 may be gradually changed continuously and smoothly. In addition, a thickness of one end that is of a second housing 72 and that is close to the hinge apparatus 14 may be less than a thickness of one end that is of the second housing 72 and that is away from the hinge apparatus 14 (which is further described below). In another implementation, the thickness of the end that is of the first housing and that is close to the hinge apparatus 14 may be smaller, and the thickness of the end that is of the first housing and that is away from the hinge apparatus 14 may be larger, and/or the thickness of each position of the first housing may be abruptly changed.

In this embodiment, in the folded state, a thickness of one end that is of the electronic device and that is close to the hinge apparatus 14 is different from a thickness of one end that is of the electronic device and that is away from the hinge apparatus 14. For example, in an implementation, as shown in FIG. 3, the thickness of the end that is of the electronic device 10 and that is close to the hinge apparatus 14 is greater than the thickness of the end that is of the electronic device 10 and that is away from the hinge apparatus 14. To be specific, in the thickness direction, a distance from the end that is of the second back surface 12b and that is close to the hinge apparatus 14 to the end that is of the first back surface 11b and that is close to the hinge apparatus 14 is greater than a distance from the end that is of the second back surface 12b and that is away from the hinge apparatus 14 to the end that is of the first back surface 11b and that is away from the hinge apparatus 14. Similarly, as shown in FIG. 5 to FIG. 8, the thickness of the end that is of the electronic device and that is close to the hinge apparatus 14 is greater than the thickness of the end that is of the electronic device and that is away from the hinge apparatus 14. Alternatively, in another implementation, as shown in FIG. 4, a thickness of one end that is of the electronic device 20 and that is close to the hinge apparatus 14 is less than a thickness of one end that is of the electronic device 20 and that is away from the hinge apparatus 14. To be specific, in the thickness direction, a distance from the end that is of the second back surface 22b and that is close to the hinge apparatus 14 to the end that is of the first back surface 11b and that is close to the hinge apparatus 14 is greater than a distance from the end that is of the second back surface 22b and that is away from the hinge apparatus 14 to the end that is of the first back surface 11b and that is away from the hinge apparatus 14.

In this embodiment, from the end away from the hinge apparatus 14 to the end close to the hinge apparatus 14, a thickness of each position of the electronic device may be gradually changed continuously and smoothly or may be abruptly changed. Meanings of "gradually changed continuously and smoothly" and "abruptly changed" are the same as above, and details are not repeated herein.

In this embodiment, thin-thick correspondences among the first housing, the second housing, and the electronic device may be combined based on an actual requirement. For example, in an implementation, as shown in FIG. 3 to FIG. 8, in a folded form, one end that is of the electronic device and that has a small thickness may correspond to one end that is of the second housing and that has a small thickness, and one end that is of the electronic device and that has a large thickness may correspond to one end that is of the second housing and that has a large thickness. That is, the end that is of the second housing and that has a small thickness may be located on one side that is of the electronic device and that has a small thickness, and the end that is of the second housing and that has a large thickness may be located on one side that is of the electronic device and that has a large thickness. The thickness of the first housing may be basically constant. In this implementation, the second housing, as a part of the electronic device, forms a thick-thick correspondence and a thin-thin correspondence with the electronic device, so that appearance consistency of the electronic device is good, and appearance experience is good.

Alternatively, in another implementation, as shown in FIG. 9, one end that is of the electronic device 70 and that has a small thickness may correspond to one end that is of the second housing 72 and that has a large thickness, and one end that is of the electronic device 70 and that has a large thickness may correspond to one end that is of the second housing 72 and that has a small thickness. That is, the end that is of the second housing 72 and that has a large thickness may be located on one side that is of the electronic device 70 and that has a small thickness, and the end that is of the second housing 72 and that has a small thickness may be located on one side that is of the electronic device 70 and that has a large thickness. In this implementation, the thicknesses of the two ends of the first housing 71 are unequal, a thick end of the first housing 71 corresponds to a thin end of the second housing 72, and a thin end of the first housing 71 corresponds to a thick end of the second housing 72. In this implementation, the first housing 71 forms a thick-thin correspondence and a thin-thick correspondence with the second housing 72. This can give a product a differentiated appearance form and improve product recognition.

A maximum thickness of the electronic device is limited to thick parts in the entire electronic device, for example, a camera module and the hinge apparatus. It is difficult to make these thick parts thin. However, in a folded state, a thickness of one end that is of a conventional electronic device and that is close to a hinge apparatus is basically the same as a thickness of one end that is of the conventional electronic device and that is away from the hinge apparatus. This causes a large overall thickness of the conventional electronic device. In this embodiment, in the folded state, a thick part may be disposed on the end that is of the electronic device and that has a large thickness, and the thickness of the end may be basically equal to that of the conventional electronic device. In the folded state, the other end of the electronic device is thinned (for example, "thinning" may be implemented by disposing a thin part or disposing fewer parts). Compared with the conventional electronic device, the electronic device is visually thinner and lighter, and holding feeling of a user is better. In particular, when the thickness of the electronic device is gradually changed continuously and smoothly, the entire electronic device has a fluent line, and the appearance experience is improved. In particular, from the end close to the hinge apparatus to the end away from the hinge apparatus, the thickness of the entire electronic device is designed to be gradually reduced. This makes an appearance form of the entire electronic device smooth and beautiful, and can thin an easily thinned end of the electronic device, so that a product design solution has high feasible and good mass productivity. Certainly, for the electronic device described above that is in the folded state and in which the end close to the hinge apparatus has a small thickness and the end away from the hinge apparatus has a large thickness, this special appearance form may be implemented through corresponding design. For example, a thickness of the hinge apparatus may be reduced, and a thick part (for example, a camera module) is disposed on the end away from the hinge apparatus.

Figure 10:
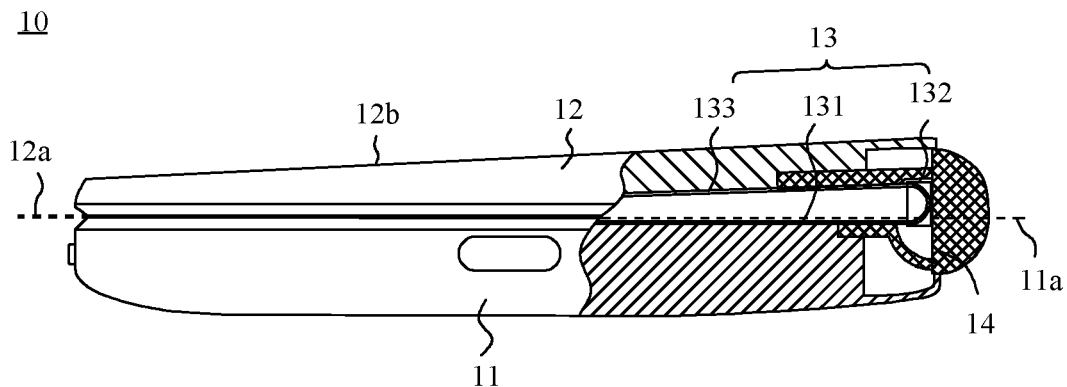
FIG. 10 is a schematic diagram of a local side-view and section-view structure of another electronic device in a folded state according to an embodiment of this application.

In an implementation of this embodiment, as shown in FIG. 10, when the electronic device 10 (the electronic device 10 is used as an example, actually, the electronic device in this implementation may be any one of the electronic device 30 to the electronic device 60) is folded, the flexible display 13 is located on the inner side of the electronic device 10, that is, the flexible display 13 is located between the second housing 12 and the first housing 11. In addition, the second flat part 133 and most of the bending part 132 of the flexible display 13 are accommodated in the second housing 12. The second flat part 133 may match an appearance form of the second housing 12. For example, the second flat part 133 may be basically parallel to the second back surface 12b of the second housing 12. In the perspective of FIG. 10, the first flat part 131 may be lower than the first top surface 11a, that is, the first flat part 131 may be accommodated in the first housing 11. In addition, the remaining small part of the bending part 132 may also be accommodated in the first housing 11. Alternatively, in another implementation, both the second flat part 133 and the entire bending part 132 are accommodated in the second housing 12, and the first flat part 131 is accommodated in the first housing 11. In the folded state, at least most of the flexible display 13 is accommodated in the second housing 12 that is thinned, so that a position of the flexible display 13 can be disposed based on an appearance form of a product. A large space of the end that is of the electronic device 10 and that is close to the hinge apparatus 14 is fully used to accommodate the bending part 132, so that the flexible display 13 has high utilization of a structural space.

In an implementation of this embodiment, "in the folded state, at least most of the flexible display 13 is accommodated in the second housing 12" may be implemented through corresponding structural design.

Figure 11:
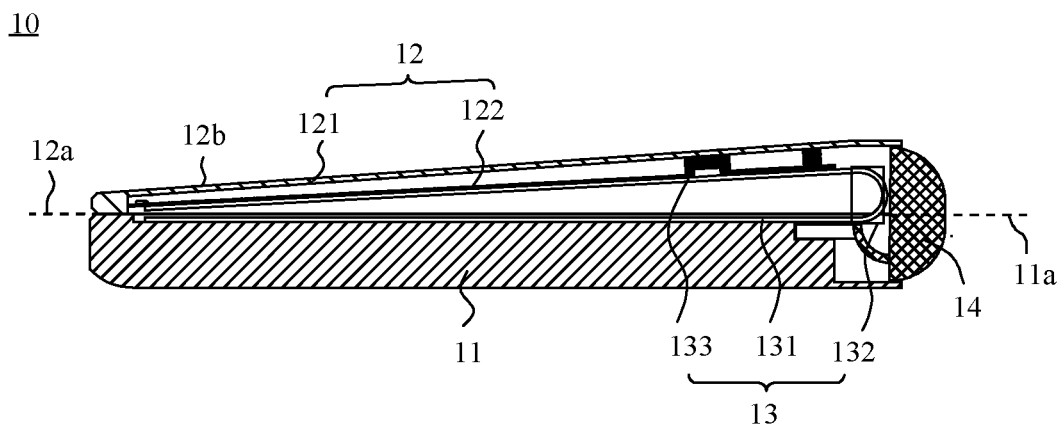
FIG. 11 is a schematic diagram of a side-view and section-view structure of another electronic device in a folded state according to an embodiment of this application.

Specifically, as shown in FIG. 11, the second housing 12 may include a first housing part 121 and a support part 122. The first housing part 121 and the first housing 11 are respectively connected to the two opposite ends of the hinge apparatus 14, and the first housing part 121 can be folded or unfolded relative to the first housing 11. The first housing part 121 is a housing of the second housing 12, and a thickness of each position of the first housing part 121 is the thickness of each position of the second housing 12. For example, one end that is of the first housing part 121 and that is close to the hinge apparatus 14 is thick, and one end that is of the first housing part 121 and that is away from the hinge apparatus 14 is thin. The support part 122 is disposed inside the first housing part 121, and is movably connected to the first housing part 121. The second flat part 133 may be mounted on a surface that is of the support part 122 and that is opposite to the first housing part 121, and the support part 122 can drive the second flat part 133 to move. When the first housing part 121 is folded relative to the first housing 11, the support part 122 rotates relative to the first housing 11, and one end that is of the support part 122 and that is close to the hinge apparatus 14 gradually approaches the first housing part 121. In this process, the bending part 132 of the flexible display 13 is gradually bent and deformed, and one end that is of the second flat part 133 and that is close to the hinge apparatus 14 and a part that is of the bending part 132 and that is adjacent to the second flat part 133 also gradually approach the first housing part 121 under traction of the support part 122. When the first housing part 121 approaches the first housing 11 to implement folding, a spacing between one end that is of the support part 122 and that is connected to the hinge apparatus 14 and the first housing 11 is gradually increased. That is, the support part 122 may gradually avoid relative to the first housing 11, so that the end that is of the second flat part 133 and that is close to the hinge apparatus 14 and the part that is of the bending part 132 and that is adjacent to the second flat part 133 occupy a space vacated after the support part 122 avoids. Finally, when the first housing part 121 and the first housing 11 are completely folded, the second flat part 133 and the at least large part of the bending part 132 are accommodated in the first housing part 121.

In this implementation, the support part 122 configured to bear the second flat part 133 is disposed in the first housing part 121, and the end that is of the support part 122 and that is connected to the hinge apparatus 14 may gradually approach the first housing part 121 in the folding process, so that the at least large part of the bending part 132 and the second flat part 133 are finally accommodated in the first housing part 121. In this design, the position of the flexible display 13 can be disposed based on the appearance form of the second housing 12, so that stacking design of the flexible display 13 can match the appearance form of the second housing 12.

In an implementation of this embodiment, based on the implementation of "accommodating at least most of the flexible display 13 in the folded state in the second housing 12", all electronic components may be disposed on one side of the first housing 11. Therefore, the second housing 12 may be made lighter and thinner, thereby making the entire electronic device slimmer, and facilitating sealed protection of the entire electronic device.

Figure 12:
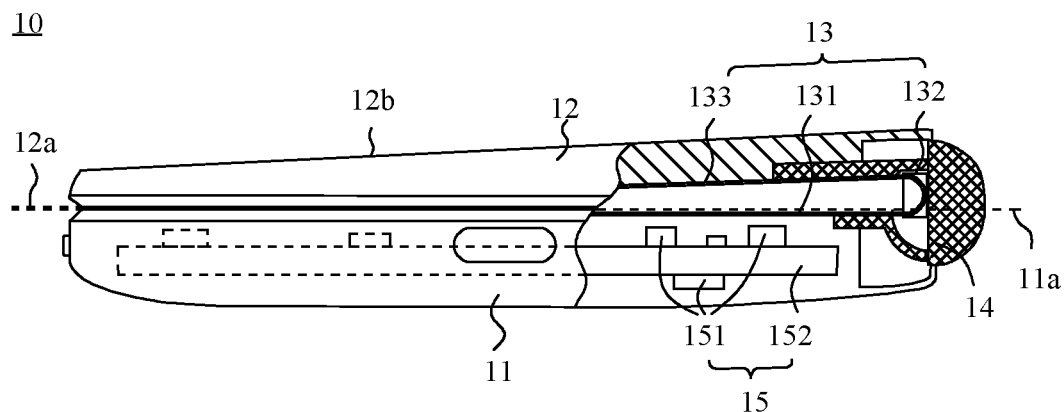
FIG. 12 is a schematic diagram of a local side-view and section-view structure of another electronic device in a folded state according to an embodiment of this application.

Specifically, as shown in FIG. 12, the electronic device 10 may include an electronic component 15. The electronic component 15 may include a circuit board 152 and electrical devices 151. The electrical devices 151 are disposed on the circuit board 152. The electrical devices 151 include but are not limited to a chip, a connector, a sensor, a switch, a camera module, a flash lamp, a breathing light, a receiver, a loudspeaker, a motor, and a battery. The electronic component 15 is mounted in the first housing 11, and the first flat part 131 is mounted on the first housing 11 and covers the electronic component 15. The second housing 12 bears the second flat part 133, and there may be no electronic component mounted in the second housing 12. Therefore, the second housing 12 does not need to have a large internal space, so that the second housing 12 can be thinned as much as possible, and the entire electronic device can be slimmer. In addition, a wire of the electronic component 15 (that is, a wire connecting the electrical device 151 and the circuit board 152) may be disposed only in the first housing 11 without passing through the first housing 11, passing through the hinge apparatus 14, and extending into the second housing 12. In this way, sealing design is performed only on the first housing 11, and sealing of the hinge apparatus 14 and the second housing 12 does not need to be specially considered for a wire problem (certainly, conventional sealing design may be performed on the hinge apparatus 14 and the second housing 12), thereby reducing difficulty of sealed protection of the entire electronic device. In this implementation, an electrical device, for example, a fingerprint sensor or a light sensor, may still be integrated in the second flat part 133. This can improve a screen-to-body ratio of the electronic device. However, the electrical device integrated in the second flat part 133 may be electrically connected to the circuit board 152 through the wire of the flexible display 13 without an additional wire. Therefore, sealing design for the second housing 12 does not need to be considered for the electrical device. Certainly, the electrical device integrated in the second flat part 133 is not essential. In another implementation, an electronic component may alternatively be disposed in the second housing 12 (the electronic component in the second housing 12 may include a circuit board and/or an electrical device).

In an implementation of this embodiment, the second housing may be further thinned by disposing the second housing into a two-part structure with a step.

Figure 13:
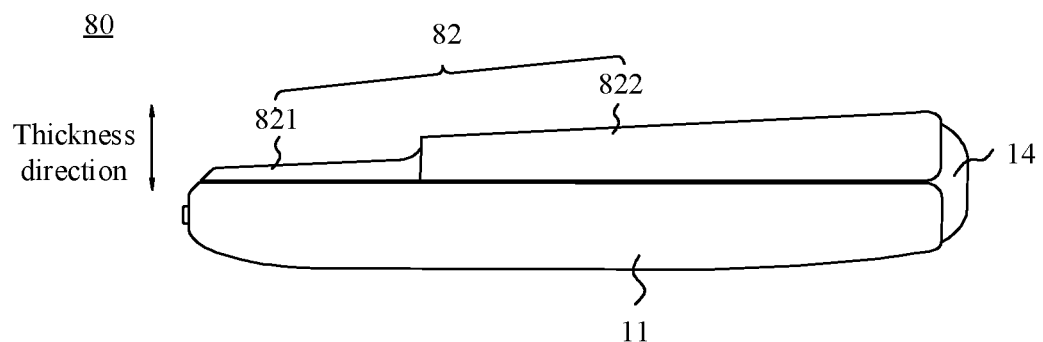
FIG. 13 is a schematic diagram of a side-view structure of another electronic device in a folded state according to an embodiment of this application.
Figure 14:
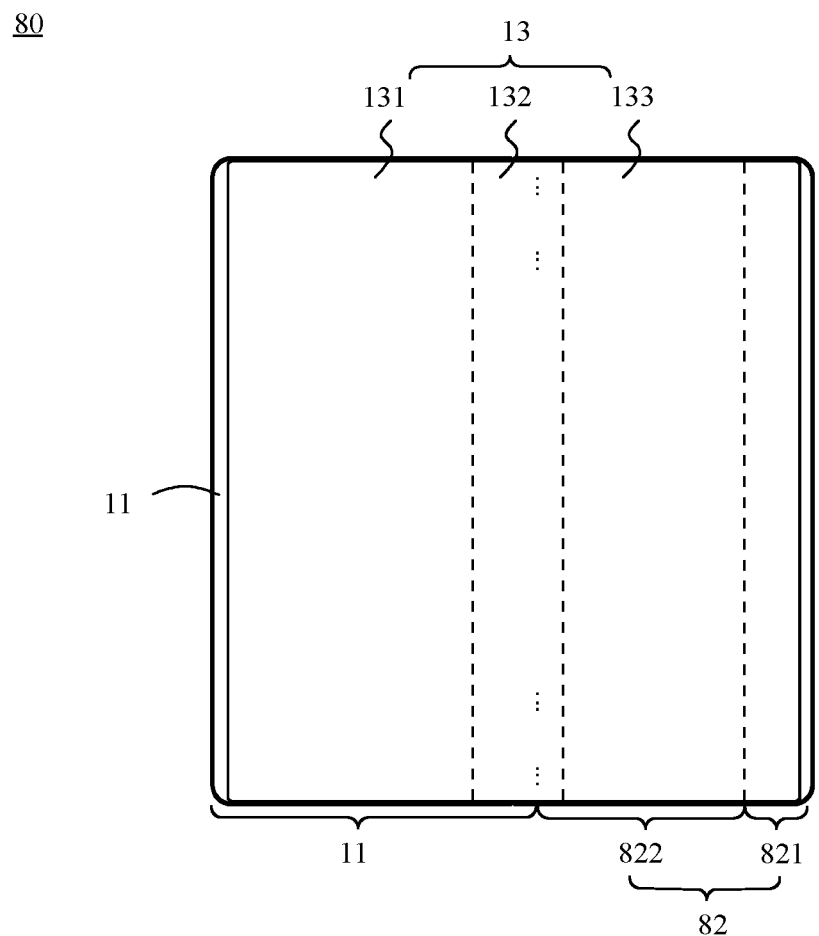
FIG. 14 is a schematic diagram of a top-view structure of the electronic device in FIG. 13 in an unfolded state.
Figure 15:
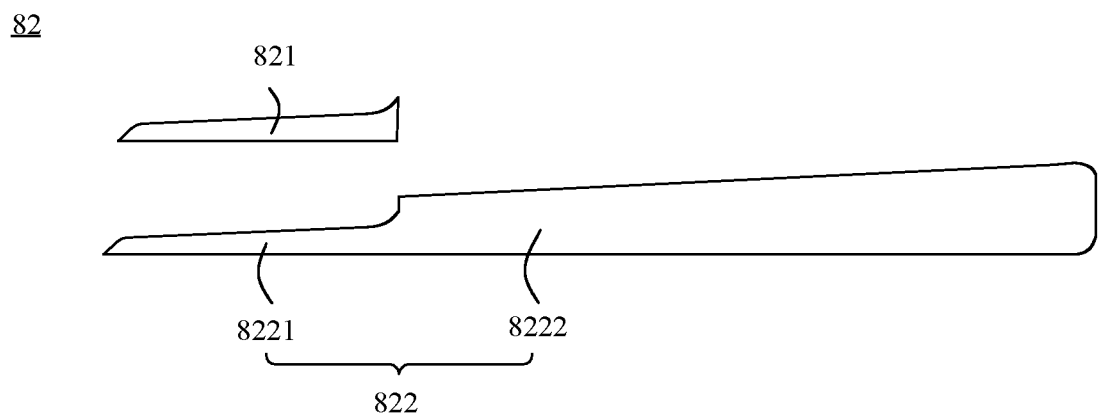
FIG. 15 is a schematic diagram of a side-view exploded structure of a second housing of the electronic device in FIG. 13.
Figure 16:
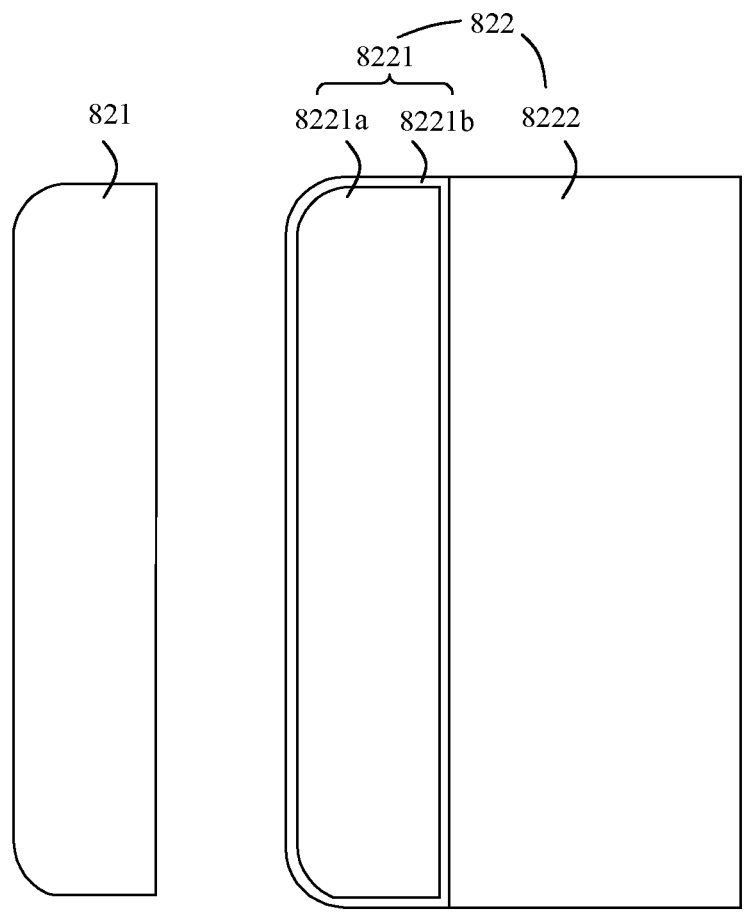
FIG. 16 is a schematic diagram of a top-view exploded structure of the second housing in FIG. 15.
Figure 17:
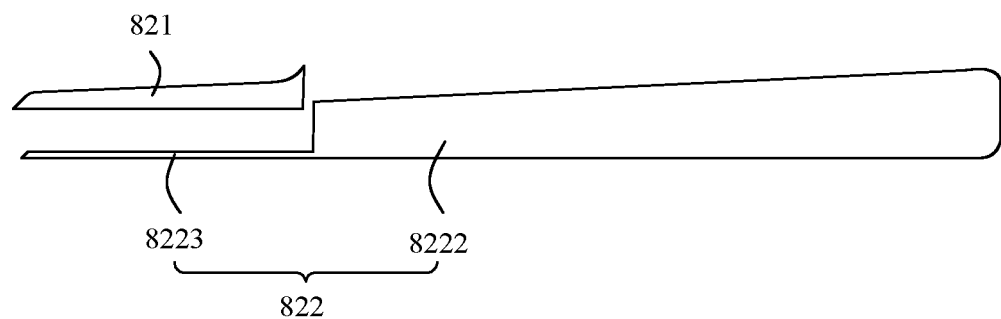
FIG. 17 is a schematic diagram of another side-view exploded structure of a second housing of the electronic device in FIG. 13.
Figure 18:
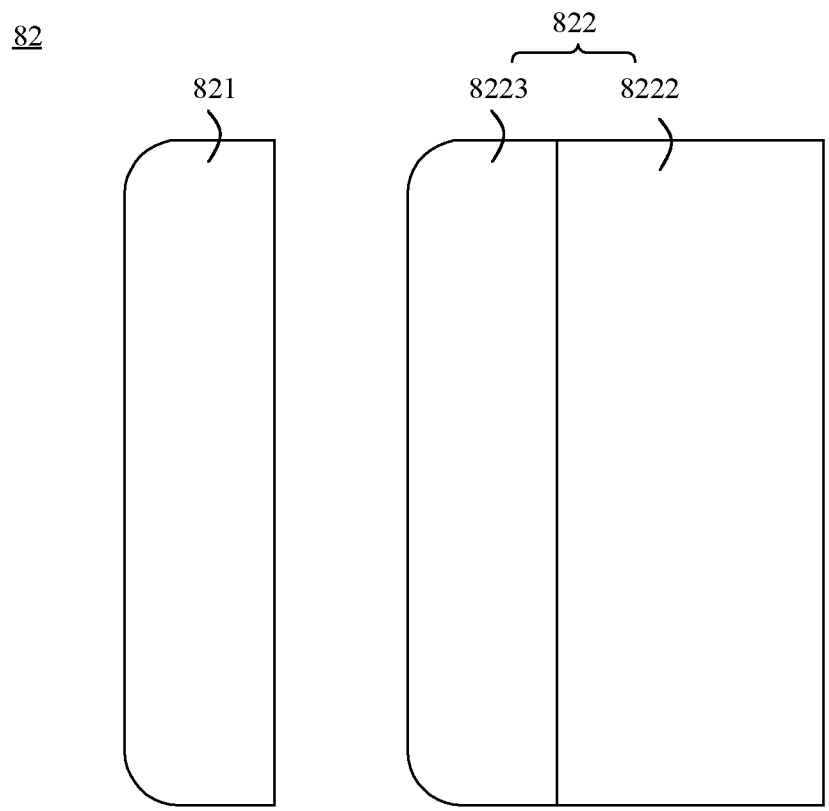
FIG. 18 is a schematic diagram of a top-view exploded structure of the second housing in FIG. 17.

Specifically, as shown in FIG. 13 and FIG. 14, in this implementation, an electronic device 80 includes a first housing 11, a flexible display 13, a second housing 82, and a hinge apparatus 14. The flexible display is accommodated between the second housing 82 and the first housing 11. The second housing 82 may include a second housing part 822 and a cover 821 that are connected. For example, in an implementation, as shown in FIG. 15 and FIG. 16, the second housing part 822 may include a main body structure 8222 and a frame structure 8221, and there is a step between the main body structure 8222 and the frame structure 8221. The frame structure 8221 may include a bottom wall 8221a and a frame 8221b surrounding a peripheral edge of the bottom wall 8221a. One side of the frame 8221b is connected to the main body structure 8222. The bottom wall 8221a may be partially hollowed out or not hollowed out. The cover 821 is mounted on the bottom wall 8221a. The frame 8221b surrounds a periphery of the cover 821. Alternatively, in another implementation, the frame structure may not include a bottom wall, but may be surrounded by several frames connected head to tail. The cover 821 is "embedded" in the frame structure, and a frame of the frame structure surrounds a periphery of the cover 821. Alternatively, in another implementation, as shown in FIG. 17 and FIG. 18, the second housing part 822 may include a main body structure 8222 and a bearing platform 8223, and there is a step between the main body structure 8222 and the bearing platform 8223. One side of the bearing platform 8223 is connected to the main body structure 8222, and the cover 821 is mounted on the bearing platform 8223. Certainly, the second housing part 822 and the cover 821 may alternatively be connected in another manner.

In this implementation, as shown in FIG. 13, one end of the second housing part 822 is connected to the hinge apparatus 14. Through the hinge apparatus 14, the second housing part 822 can be folded or unfolded relative to the first housing 11. The cover 821 is fixedly connected to one end that is of the second housing part 822 and that is away from the hinge apparatus 14, and the cover 821 may move with the second housing part 822. A thickness of one end that is of the cover 821 and that is away from the second housing part 822 may be less than a thickness of one end that is of the cover 821 and that is adjacent to the second housing part 822, and the thicknesses of the two ends of the cover 821 may be gradually changed continuously and smoothly, and thickness change rates of the two ends of the cover 821 may be the same as a thickness change rate of the second housing part 822 (similar to that shown in FIG. 5). Alternatively, thicknesses of various positions of the cover 821 may be basically the same (similar to that shown in FIG. 6). The end that is of the cover 821 and that is away from the second housing part 822 may be basically aligned with the first housing 11.

In this implementation, as shown in FIG. 14, the first flat part 131 of the flexible display 13 is mounted on the first housing 11. The second flat part 133 is mounted on the second housing 82, and is opposite to both the second housing part 822 and the cover 821. For example, in a structure of the second housing part 822 shown in FIG. 15 and FIG. 16, the second flat part 133 may be in contact with a surface of the main body structure 8222 and the bottom wall 8221a of the frame structure 8221, and may not be in contact with the cover 821. Alternatively, in a manner in which the frame structure of the second housing part 822 does not include a bottom wall, the second flat part 133 may be in contact with a surface of the main body structure 8222, a surface of the frame structure, and a surface of the cover 821. Alternatively, in a structure of the second housing part 822 shown in FIG. 17 and FIG. 18, the second flat part 133 is in contact with only a surface of the main body structure 8222 and a surface of the bearing platform 8221, and is not in contact with the cover 821. In the foregoing implementations, the second flat part 133 is always opposite to the second housing part 822 and the cover 821.

Refer to FIG. 13 and FIG. 14. When the electronic device 80 is folded, the cover 821 may cover a local area of the first flat part 131. In this implementation, a step is formed between a surface that is of the cover 821 and that is away from the second flat part 133 and a surface that is of the second housing part 822 and that is away from the second flat part 133, that is, the cover 821 may be sunk, relative to the second housing part 822, towards the first housing 11. Therefore, the second housing 82 is divided into two parts of different thicknesses. The sunken cover 821 can make an end part of the second housing 82 thinner and visually make the second housing 82 and electronic device 80 lighter and thinner. In another implementation, the second housing 82 does not need to have this step structure, and there is no step between the surface that is of the cover 821 and that is away from the second flat part 133 and the surface that is of the second housing part 822 and that is away from the second flat part 133. In this solution, a novel product appearance can be made by disposing a separated second housing 82.

In an implementation of this embodiment, based on the solution in which the second housing 82 has a step structure or has no step structure, the cover 821 may be made of a transparent material (for example, glass). When the cover 821 covers the local area of the first flat part 131, a user can see the local area through the cover 821. To fully use the local area to display information to improve user experience, a call reminder, an information preview, a time, a weather forecast, a power reminder, a signal status, and the like may be displayed in the local area. In another implementation, the cover 821 may alternatively be made of a non-transparent material. In this case, the cover 821 may be used to thin the second housing 82 and the electronic device 80, or give a novel appearance to the product.

Figure 19:
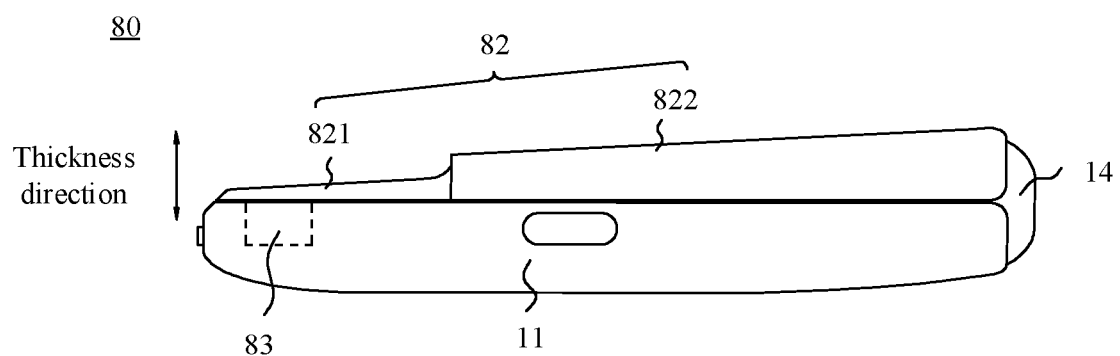
FIG. 19 is a schematic diagram of a side-view structure of another electronic device in a folded state according to an embodiment of this application.

In an implementation of this embodiment, a transparent cover 821 may be disposed, and light of a target object is collected through the cover 821, to implement a corresponding function. Specifically, as shown in FIG. 19, the electronic device 80 may further include an optical device 83 (for example, a camera, a light sensor, an iris module, or an optical fingerprint module). The optical device 83 is disposed in the first housing 11 and is located in the local area of the first flat part 131. For example, the optical device 83 may be disposed under the flexible display (in this case, the flexible display may have a transparent area, and the optical device 83 is arranged in alignment with the transparent area) and falls into the local area, or may be disposed in the flexible display (for example, the flexible display may form a mounting cavity, and the optical device 83 is mounted in the mounting cavity; or the optical device 83 is integrated in a layer structure of the flexible display, and the optical device 83 is formed together in a manufacturing process of the flexible display) and falls into the local area. The optical device 83 is configured to collect the light of the target object to generate an electrical signal, and the electrical signal carries information about the target object. When the electronic device is folded, the cover covers the flexible display and the optical device 83 on the first housing 11, the light of the target object may be incident on the optical device 83 through the cover, and the optical device 83 senses the light to generate the electrical signal. The electrical signal may be output to a processing circuit for processing, to implement information collection of the target object (for example, an image of the target object may be obtained, approaching of the target object may be perceived, iris information may be obtained, and fingerprint information may be obtained). This design enables the user to collect information without opening the second housing 82, thereby improving user experience. In this implementation, the step may be formed or there may be no step formed between the cover 821 and the second housing part 822. In another implementation, the optical device 83 is not essential.

The foregoing descriptions are merely specific implementations of this application, but are not intended to limit the protection scope of this application. Any change or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
   a first housing comprising a parting surface and a placement surface;
   a second housing comprising:
      a first end;
      a second end;
      a first housing part, wherein the first housing part is configured to be folded or unfolded relative to the first housing; and
      a support part is movably mounted in the first housing part and configured to rotate relative to the first housing;
   a hinge apparatus comprising two opposite ends respectively connected to the first housing and the first housing part, wherein one end that is of the support part and that is close to the hinge apparatus gradually approaches the first housing part when the first housing part is folded relative to the first housing; and
   a flexible display mounted on the first housing and the second housing and comprising a first flat part and a second flat part, wherein the first flat part is configured to mount parallel to the parting surface and the second flat part is configured to mount on a surface that is of the support part and that is opposite to the second housing when the first housing is folded relative to the second housing so that the parting surface faces the second housing,
   wherein a first thickness of the first end that is close to the hinge apparatus is different from a second thickness of the second end that is away from the hinge apparatus, and
   wherein a third thickness of a third end of the electronic device that is close to the hinge apparatus is different from a fourth thickness of a fourth end of the electronic device that is away from the hinge apparatus when the first housing is folded relative to the second housing.

2. The electronic device of claim 1, wherein the first end that has a small thickness and the third end that has a small thickness are located on a same side of the electronic device when the first housing is folded relative to the second housing.

3. The electronic device of claim 1, wherein the first thickness is greater than the second thickness.

4. The electronic device of claim 1, wherein the first housing further comprises a placement surface mounted parallel to the parting surface and facing opposite to the second housing when the first housing is folded relative to the second housing.

5. The electronic device of claim 4, wherein a thickness of the placement surface is constant.

6. The electronic device of claim 1, wherein when the first housing is folded relative to the second housing, the flexible display is located between the second housing and the first housing and further comprises:
   a bending part; and
   a second flat part mounted on the second housing,
   wherein the first flat part, the second flat part, and the bending part are connected, and
   wherein both the second flat part and the bending part are accommodated in the second housing.

7. The electronic device of claim 6, wherein the electronic device further comprises an electronic component mounted in the first housing, and wherein the first flat part covers the electronic component.

8. The electronic device of claim 7, wherein the electronic component comprises a circuit board and an electrical device.

9. The electronic device of claim 6, wherein the bending part is located between the first housing and the second housing.

10. The electronic device of claim 1, wherein the second housing further comprises:
    a second housing part comprising a fifth end and a sixth end connected to the hinge apparatus, wherein the second housing part is configured to be folded relative to the first housing; and
    a cover connected to the fifth end that is away from the hinge apparatus, wherein when the first housing is folded or unfolded relative to the second housing, the flexible display is accommodated between the second housing and the first housing and further comprises a second flat part mounted on the second housing, wherein the second flat part is opposite to both the second housing part and the cover, and wherein when the first housing is folded relative to the second housing, the cover covers a local area of the first flat part.

11. The electronic device of claim 10, further comprising a step between a surface that is of the cover and that is away from the second flat part and a surface that is of the second housing part and that is away from the second flat part.

12. The electronic device of claim 10, wherein the cover is made of a transparent material, and wherein the electronic device further comprises an optical device disposed in the first housing and located at the local area.

13. The electronic device of claim 1, wherein the first housing and the second housing are configured to be bearers of the flexible display.

14. The electronic device of claim 1, wherein the hinge apparatus includes a plurality of parts that are rotatably connected.

15. The electronic device of claim 1, wherein the flexible display is a flexible organic light-emitting diode display.

16. The electronic device of claim 1, wherein a change rate of a thickness of the second housing is constant.

17. The electronic device of claim 1, wherein a thickness of the second housing is abruptly changed.

18. The electronic device of claim 1, wherein the electronic device is a mobile phone or a tablet computer.

19. The electronic device of claim 1, wherein the electronic device is an electronic reader.

20. The electronic device of claim 1, wherein the electronic device is a vehicle-mounted device.

* * * * *